United States Patent
Converse et al.

(10) Patent No.: US 9,018,511 B2
(45) Date of Patent: Apr. 28, 2015

(54) SPRING-LOADED HEAT EXCHANGER FINS

(71) Applicant: Hamilton Sundstrand Space Systems International Inc., Windsor Locks, CT (US)

(72) Inventors: David G. Converse, Hampden, MA (US); Thomas J. Stapleton, Southwick, MA (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 138 days.

(21) Appl. No.: 13/790,943

(22) Filed: Mar. 8, 2013

(65) Prior Publication Data

US 2014/0251404 A1     Sep. 11, 2014

(51) Int. Cl.
*H01L 35/30* (2006.01)
*F28F 3/02* (2006.01)
*H01L 23/36* (2006.01)

(52) U.S. Cl.
CPC ............... *H01L 35/30* (2013.01); *H01L 23/36* (2013.01)

(58) Field of Classification Search
CPC .................................. H01L 35/30; F28F 3/02
USPC ........ 136/203, 204, 205, 206; 165/48.1, 48.2, 165/55, 80.3, 185
See application file for complete search history.

(56) References Cited

U.S. PATENT DOCUMENTS

| | | |
|---|---|---|
| 4,622,822 A | 11/1986 | Beitner |
| 5,355,678 A | 10/1994 | Beitner |
| 5,584,183 A | 12/1996 | Wright et al. |
| 6,397,581 B1 | 6/2002 | Vedal et al. |
| 6,502,405 B1 | 1/2003 | Van Winkle |
| 6,532,746 B1 | 3/2003 | Bloom et al. |
| 6,598,405 B2 | 7/2003 | Bell |
| 7,360,365 B2 | 4/2008 | Codecasa et al. |
| 7,779,811 B1 | 8/2010 | Mailander et al. |
| 7,832,215 B2 | 11/2010 | Atkinson |
| 8,081,465 B2 | 12/2011 | Nishiura |
| 8,127,555 B2 | 3/2012 | Jarmon et al. |
| 8,313,056 B2 | 11/2012 | Jarmon et al. |
| 2006/0118159 A1* | 6/2006 | Tsuneoka et al. ............. 136/211 |
| 2007/0018038 A1 | 1/2007 | Jarmon et al. |
| 2007/0235164 A1 | 10/2007 | Miyagawa et al. |
| 2009/0065175 A1* | 3/2009 | Bang et al. ................... 165/80.3 |
| 2010/0009248 A1 | 1/2010 | Fuhrmann et al. |
| 2012/0012146 A1* | 1/2012 | Salzgeber ..................... 136/205 |

FOREIGN PATENT DOCUMENTS

| | | |
|---|---|---|
| EP | 0 335 475 B1 | 5/1994 |
| JP | 2007211748 A | 8/2007 |

(Continued)

OTHER PUBLICATIONS

SU 1535460A Kuzmich P K et al., English equivalent of the abstract.*

(Continued)

*Primary Examiner* — Susan D Leong
(74) *Attorney, Agent, or Firm* — Kinney & Lange, P.A.

(57) ABSTRACT

A heat exchanger includes a first plate and a second plate connected to the first plate to define a duct between the first plate and the second plate. At least one elastic cooling fin is disposed inside the duct between the first plate and the second plate. The at least one elastic fin exerts a load on the first plate.

21 Claims, 2 Drawing Sheets

(56) References Cited

FOREIGN PATENT DOCUMENTS

| | | | |
|---|---|---|---|
| SU | 1535460 A | * | 1/1990 |
| WO | 13002424 A1 | | 1/2013 |

OTHER PUBLICATIONS

The Netherlands Office Action dated Jan. 29, 2015 for Netherlands Application No. 2012372.

* cited by examiner

SPRING-LOADED HEAT EXCHANGER FINS

STATEMENT OF GOVERNMENT INTEREST

This invention was made with government support under Contract No. N00014-08-C-0161 awarded by the United States Navy. The government has certain rights in the invention.

BACKGROUND

This invention relates to heat exchanger fins coupled to a thermoelectric module.

A thermoelectric module is a device which converts a heat differential directly into electrical energy through the Seebeck effect, or when operated in reverse, converts electrical energy into a heat differential through the Peltier effect. A thermoelectric module generally uses semiconductor p-n junctions sandwiched between a pair of flat parallel substrates, constructed of a material having relatively low electrical conductivity and high thermal conductivity, such as aluminum oxide. Each thermoelectric module includes a hot side, the side that absorbs heat, and a cold side, the side that expels heat. The thermoelectric module is typically mounted between two parallel plates, one plate on the hot side of the thermoelectric module and one plate on the cold side of the thermal electric module. The cold-side plate generally includes cooling fins and the hot-side generally includes heating fins. The heating fins transfer heat from a heat source toward the thermoelectric module and the cooling fins transfer the heat away from the thermoelectric module after the heat has crossed the thermoelectric module. As the cooling fins on the cold-side plate and the heating fins on the hot-side plate transfer heat across the thermoelectric module, the thermoelectric module generates an electric voltage. It is important that the cold-side plate and the hot-side plate maintain a close thermal contact with the thermal electric module to maximize the heat transfer rate across the thermoelectric module. Maximizing the heat transfer rate across the thermoelectric module maximizes the efficiency and electric output of the thermoelectric module.

A common prior art method for mounting the thermoelectric module between the cold-side plate and the hot-side plate is to use bolts to connect the plates together with the thermoelectric module compressed in between. Mounting the thermoelectric module between the plates with bolts in this manner results in bending moments on the plates, causing the plates to bow apart at the center. The bowing of the plates reduces the thermal contact area between the plates and the thermal electric module, thereby decreasing its efficiency. The thickness of the plates could be increased to stiffen the plates against bowing. However, increasing the thickness of the plates would increase the thermal resistance of the plates, thereby decreasing the heat transfer rate across the thermoelectric module.

In addition to decreasing the efficiency of the thermoelectric module, simply compressing the thermoelectric module between the plates with bolts applies non-uniform compressional forces to the thermoelectric module. These non-uniform compressional forces may cause high pressure regions to develop on the thermoelectric module, causing the thermoelectric module to fracture during the assembly process or during operation.

SUMMARY

According to the present invention, a heat exchanger includes a first plate and a second plate connected to the first plate to define a duct between the first plate and the second plate. At least one elastic cooling fin is disposed inside the duct between the first plate and the second plate. At least one elastic cooling fin exerts a load on the first plate.

In another embodiment of the present invention, a heat exchanger fin assembly includes a first plate and a curved fin with a first end and a second end. The first end of the curved fin is disposed on the first plate and a second plate is disposed against the second end of the curved fin. The curved fin exerts a load against the first plate and the second plate.

In another embodiment of the present invention, a thermal electric power generator for converting thermal energy into electricity includes a first plate, a second plate, and a third plate. A thermoelectric module is disposed between the first plate and the third plate. A heating duct is proximate the third plate and a heating fin extends from the third plate into the heating duct. A cooling duct disposed between the first plate and the second plate, and a cooling fin elastically compressed between the first plate and the second plate such that the cooling fin pushes the first plate against the thermoelectric module.

DETAILED DESCRIPTION

The present invention provides a heat exchanger coupled to a thermoelectric module. The heat exchanger includes a first plate, a second plate, and elastic cooling fins disposed between the first plate and the second plate. The elastic cooling fins are compressed between the first plate and the second plate such that the elastic cooling fins push the first plate against the thermoelectric module to keep the first plate in thermal contact with the thermoelectric module. Cooling air flows between the first plate and the second plate and across the cooling fins.

Figure 1:
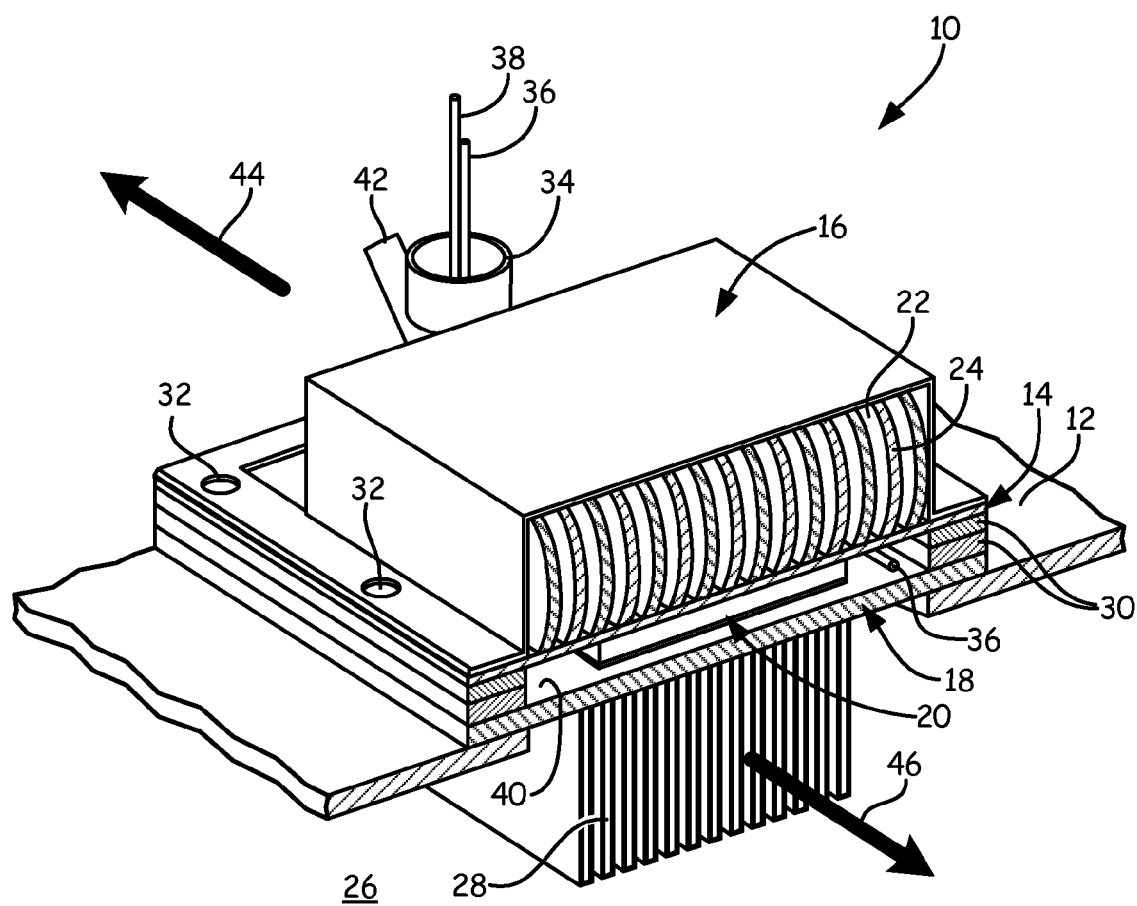
FIG. 1 is a perspective cross-sectional view of a thermal electric power generator.

FIG. 1 is a perspective cross-sectional view of thermal electric power generator 10 for converting thermal energy into electricity. As shown in FIG. 1, thermal electric power generator 10 includes casing 12, first plate 14, second plate 16, third plate 18, thermoelectric module 20, cooling duct 22, cooling fins 24, heating duct 26, heating fins 28, spacers 30, screws 32, electrical conduit 34, lead wire 36, return wire 38, gap 40, and cavity port 42. Cool air 44 flows through cooling duct 22, and hot gas 46 flows through heating duct 26.

Screws 32 connect second plate 16 to first plate 14 to define cooling duct 22. Screws 32 also connect third plate 18 to first plate 14 opposite second plate 16. Spacers 30 are disposed between first plate 14 and third plate 18 to define gap 40 between first plate 14 and third plate 18. Screws 32 also connect first plate 14, second plate 16, and third plate 18 to casing 12 such that casing 12 is disposed against third plate 18 opposite first plate 14. Casing 12 defines heating duct 26. Cooling fins 24 are disposed inside cooling duct 22 and extend between first plate 14 and second plate 16. Thermoelectric module 20 is disposed inside gap 40 between and against first plate 14 and third plate 18. Heating fins 28 are connected to third plate 18 and extend from third plate 18 past casing 12 into heating duct 26. Electrical conduit 34 is connected to first plate 14 and provides an entry into gap 40 for lead wire 36 and return wire 38. Lead wire 36 and return wire 38 are electrically connect to thermoelectric module 20 and may connect thermoelectric module 20 as a power source to an electrical circuit. Additionally, more than one thermoelectric module 20 may be disposed inside gap 40 and lead wire 36 and return wire 38 may connect thermoelectric modules 20 in parallel or in a series. Cavity port 42 is also connected to first plate 14 and is in fluid communication with gap 40. Cavity port 42 may include a stem valve and may be used to fill gap 40 with an inert gas, such as argon, or to evacuate gap 40. Filling gap 40 with an inert gas protects thermoelectric module 20 and the interfaces between thermoelectric module 20, first plate 14 and third plate 18 against oxidation as heat transfers across thermoelectric module 20. Preventing oxidation of components in thermal systems is beneficial as oxidation generally increases the thermal resistance of components, thereby lowering their thermal conductivity.

Hot gas 46 flows inside heating duct 26 and across heating fins 28. Hot gas 46 may be generated from a gas fuel or liquid fuel burner disposed inside casing 12. Heating fins 28 transfer the heat to third plate 18, and third plate 18 transfers the heat to thermoelectric module 20. The heat travels across thermoelectric module 20 to first plate 14. As the heat travels across thermoelectric module 20, thermoelectric module 20 produces a voltage difference which generates a current in lead wire 36 and return wire 38. The heat transfers from first plate 14 to cooling fins 24. Cooling fins 24 transfer the heat to cool air 44 as cool air 44 flows through cooling duct 22. A fan may be used to push or pull cool air 44 through cooling duct 22 and across cooling fins 24. Cooling duct 22 may draw cool air 44 from ambient atmosphere and vent cool air 44 to atmosphere once cool air 44 has traveled across cooling fins 24 and heated. The electric output of thermoelectric module 20 is a function of the heat transfer rate across thermoelectric module 20. The greater the heat transfer rate across thermoelectric module 20, the greater the electrical output of thermoelectric module 20. Factors that effect the heat transfer rate across thermoelectric module 20 include the temperature differential between hot gas 46, cool air 44, the thermal resistance of heating fins 28, third plate 18, first plate 14, and cooling fins 24, and the size of the contact area between thermoelectric module 20 and first plate 14 and the contact area between thermoelectric module 20 and third plate 18.

In prior art assemblies, maintaining full thermal contact between thermoelectric modules and adjacent components has been an ongoing problem as thermal expansion and mounting hardware will cause the adjacent components to flex and bend and, thereby forming spaces between the adjacent components and the thermoelectric modules. These spaces reduce the contact area between the adjacent components and the thermoelectric modules, causing a reduction in the heat transfer rate across the thermal electric modules. As discussed below in the description of FIG. 2, cooling fins 24 prevent spaces from forming between thermoelectric module 20, first plate 14, and third plate 18 by ensuring that first plate 14 and third plate 18 remain in full thermal contact with thermoelectric module 20.

Figure 2:
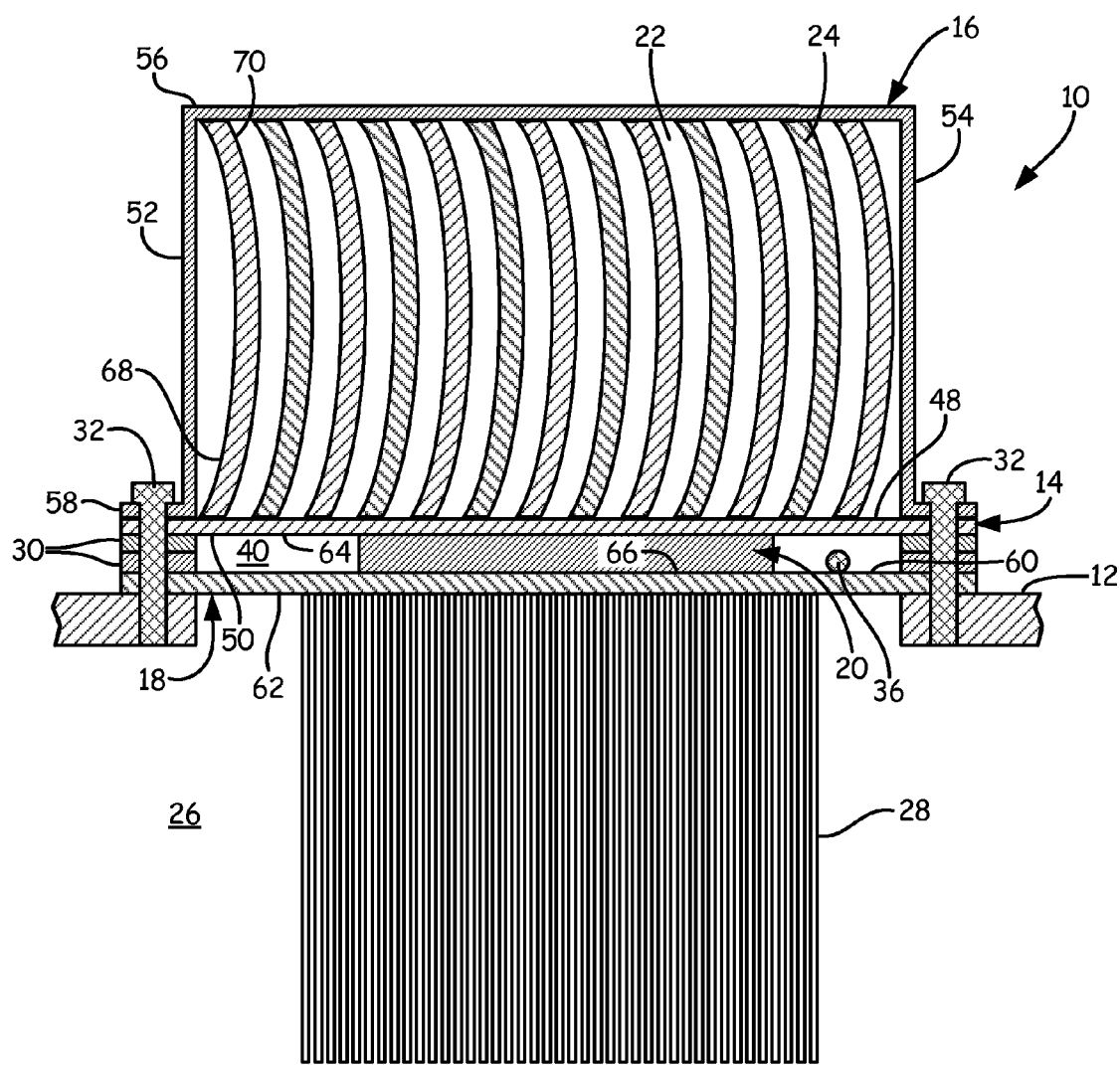
FIG. 2 is a side cross-sectional view of the thermal electric power generator from FIG. 1.

FIG. 2 is a side cross-sectional view of thermal electric power generator 10 from FIG. 1. As shown in FIG. 2, thermal electric power generator 10 includes casing 12, first plate 14, second plate 16, third plate 18, thermoelectric module 20, cooling duct 22, cooling fins 24, heating duct 26, heating fins 28, spacers 30, screws 32, lead wire 36, and gap 40. First plate 14 includes first side 48 and second side 50. Second plate 16 includes first side panel 52, second side panel 54, top panel 56, and flanges 58. Third plate 18 includes first side 60 and second side 62. Cooling fins 24 each include first end 68 and second end 70.

In FIG. 2, components of like numbering with the components of FIG. 1 are assembled as discussed above with reference to FIG. 1. First side panel 52 and second side panel 54 extend from top panel 56 of second plate 16 and are positioned on top panel 56 opposite one another. Flanges 58 are formed on first side panel 52 and second side panel 54 opposite top panel 56. Flanges 58 contain holes for receiving screws 32 to connect flanges 58 to first side 48 of first plate 14. First side panel 52, second side panel 54, and top panel 56 of second plate 16 along with first side 50 of first plate 14 enclose and define cooling duct 22. Second side 50 of first plate 14, spacers 30, and first side 60 of third plate 18 define and enclose gap 40. Thermoelectric module 20 is disposed inside gap 40 between second side 50 of first plate 14 and first side 60 of third plate 18. Cold side 64 of thermoelectric module 20 abuts second side 50 of first plate 14. Cold side 64 is the side of thermoelectric module 20 that expels heat. Hot side 66 of thermoelectric module 20 abuts first side 60 of third plate 18. Hot side 66 is the side of thermoelectric module 20 that absorbs heat. In the embodiment of FIG. 2, cold side 64 of thermoelectric module 20 may be adhered to second side 50 of first plate 14 by a high temperature adhesive or epoxy, such as Pyro-Putty®, to reduce movement of thermoelectric module 20 inside gap 40. While hot side 66 of thermoelectric module 20 abuts first side 60 of third plate 18, hot side 66 may be mechanically or chemically disconnected from first side 60 to allow shifting between thermoelectric module 20 and third plate 18 as third plate 18 undergoes thermal expansion during operation. Heating fins 28 are connected to second side 62 of third plate 18 and extend from second side 62 past casing 12 into heating duct 26.

Cooling fins 24 are curved or bowed with a "C"-shaped cross-sectional profile that extends between first end 68 and second end 70. The curved "C"-shaped cross-sectional profile allows cooling fins 24 to be elastically compressed and function as springs. Cooling fins 24 are compressed between top panel 56 of second plate 16 and first side 48 of first plate 14. First end 68 of each cooling fin 24 may be brazed to first side 48 of first plate 14. While second end 70 of each cooling fin 24 abuts top panel 56 of second plate 16, second end 70 of each cooling fin 24 may be mechanically or chemically disconnected from top panel 56. Disconnecting cooling fins 24 from top panel 56 allows shifting between cooling fins 24 and second plate 16 as first plate 14 and cooling fins 24 undergo thermal expansion during operation. If cooling fins 24 and top panel 56 were not permitted to shift, stress concentrations would build up inside cooling fins 24 and second plate 16, leading to wear and reduce life of cooling fins 24. Because cooling fins 24 are elastically compressed between first plate 14 and top panel 56 of second plate 16, each cooling fin 24 exerts a reaction load or force against first plate 14 and second plate 16. First plate 14 is compliant such that first plate 14 may be flexed and pushed by cooling fins 24. Second plate 16 may be stiff and noncompliant such that second plate 16 backs up and supports cooling fins 24. During operation, as the heat transfers across third plate 18, thermoelectric module 20, and first plate 14, as discussed above in the description of FIG. 1, first plate 14 and third plate 18 may undergo thermal expansion. As first plate 14 and third plate 18 thermally expand and contract, cooling fins 24 continually push first plate 14 against cold side 64 of thermoelectric module 20, and also continually push hot side 66 of thermoelectric module 20 against third plate 18. By continually pushing first plate 14 against thermoelectric module 20, cooling fins 24 ensure that first plate 14 is in constant thermal contact with thermoelectric module 20. Similarly, by continually pushing thermoelectric module 20 against third plate 18, cooling fins 24 ensure that third plate 18 is in constant thermal contact with thermoelectric module 20.

Cooling fins 24 are also evenly distributed across first side 48 of first plate 14. By evenly distributing cooling fins 24 on first plate 14, cooling fins 24 apply evenly distributed loads across first plate 14, thermoelectric module 20, and third plate 18. Because cooling fins 24 apply evenly distributed loads, cooling fins 24 evenly press first plate 14 against thermoelectric module 20. With cooling fins 24 evenly pressing first plate 14 against thermoelectric module 20, spaces are unable to develop between first plate 14 and thermoelectric module 20 during assembly or operation of thermal electric power generator 10. Similarly, cooling fins 24 evenly press thermal electric module 20 against third plate 18, preventing spaces from developing between thermoelectric module 20 and third plate 18. Third plate 18 may also be compliant such that third plate 18 evenly flexes into full contact with thermoelectric module 20 as thermoelectric module 20 presses against third plate 18. Because cooling fins 24 prevent spaces from developing between thermoelectric module 20 and first plate 14, and thermoelectric module 20 and third plate 18, cooling fins 24 maximize the thermal contact that thermoelectric module 20 shares with first plate 14 and third plate 18. Maximizing the thermal contact that thermoelectric module 20 shares with first plate 14 and third plate 18 increases the heat transfer rate across thermoelectric module 20 and increases the electrical output of thermoelectric module 20, as discussed above in the description of FIG. 1. By evenly distributing their loads across thermoelectric module 20, cooling fins 24 also prevent stress concentrations from arising in thermoelectric module 20.

In view of the foregoing description, it will be recognized that the present disclosure provides numerous advantages and benefits. For example, the present disclosure provides thermal electric power generator 10 with cooling fins 24 and thermoelectric module 20. Cooling fins 24 evenly press thermoelectric module 20 against its neighboring components to maximize its thermal contact area with those components, thereby maximizing the thermal efficiency and electrical output of thermoelectric module 20. In addition, cooling fins 24 press evenly on thermal electric module, preventing stress concentrations from arising in thermoelectric module 20 that may damage or shorten the life of thermoelectric module 20.

While the invention has been described with reference to an exemplary embodiment(s), it will be understood by those skilled in the art that various changes may be made and equivalents may be substituted for elements thereof without departing from the scope of the invention. For example, while the specification describes cooling fins 24 has having a "C"-shaped cross-sectional profile, cooling fins 24 may include any cross-sectional profile that permits them to function both as a heat-exchanging fin and an elastic spring. Additionally, while cooling fins 24 have been describe in the specification in context of thermal electric power generator 10 with thermoelectric module 20, cooling fins 24 may be applied in any electrical, chemical, or mechanical system that requires heat-exchanger fins. In addition, many modifications may be made to adapt a particular situation or material to the teachings of the invention without departing from the essential scope thereof. For example, while the invention has been described as including elastic cooling fins 24 disposed in cooling duct 22, the invention may be modified to include elastic heating fins disposed in a heating duct without departing from the essential scope of the invention. Therefore, it is intended that the invention not be limited to the particular embodiment(s) disclosed, but that the invention will include all embodiments falling within the scope of the appended claims.

The invention claimed is:

1. A heat exchanger fin assembly comprising:
   a first plate;
   a curved fin with a first end and a second end, the first end being disposed on the first plate; and
   a second plate disposed against the second end of the curved fin, wherein the curved fin is elastically compressed between the first plate and the second plate and exerts a load against the first plate and the second plate, wherein the first plate is compliant and deformed by the curved fin.

2. The heat exchanger fin assembly of claim 1, wherein a cross-sectional profile of the curved fin is generally "C"-shaped.

3. The heat exchanger fin assembly of claim 1, wherein the first end of the curved fin is brazed to the first plate.

4. The heat exchanger fin assembly of claim 1, wherein the first plate comprises:
   a first side and a second side; and
   wherein the curved fin is disposed on the first side and a thermoelectric module is disposed on the second side opposite the curved fin.

5. The heat exchanger fin assembly of claim 4, wherein a third plate is disposed against the thermoelectric module opposite the first plate.

6. The heat exchanger fin assembly of claim 5, wherein the first plate and the third plate are compliant.

7. The heat exchanger fin assembly of claim 5, wherein a second fin is disposed on the third plate opposite the thermoelectric module.

8. The heat exchanger fin assembly of claim 5, wherein an inert gas atmosphere is disposed between the first plate and the third plate.

9. The heat exchanger fin assembly of claim 5, wherein an evacuated space is disposed between the first plate and the third plate.

10. The heat exchanger fin assembly of claim 5, wherein screws fasten the first plate, the second plate, and the third plate together.

11. The heat exchanger fin assembly of claim 1, wherein the second plate is noncompliant.

12. A heat exchanger comprising:
   a first plate;
   a second plate connected to the first plate to define a duct between the first plate and the second plate; and
   at least one elastic fin disposed inside the duct between the first plate and the second plate, wherein the at least one elastic fin is elastically compressed between the first plate and the second plate and exerts a load on the first plate, wherein the first plate is compliant and deformed by the at least one elastic fin.

13. The heat exchanger of claim 12, wherein a cold side of a thermoelectric module is disposed against the first plate opposite the duct.

14. The heat exchanger of claim 13, wherein the at least one elastic fin pushes the first plate against the cold side of the thermoelectric module.

15. The heat exchanger of claim 13, wherein the cold side of the thermoelectric module is adhered to the first plate.

16. The heat exchanger of claim 13, wherein a third plate is disposed on a hot side of the thermoelectric module.

17. The heat exchanger of claim 16, wherein the at least one elastic fin pushes the thermoelectric module against the third plate.

18. The heat exchanger of claim 16, wherein a second fin is disposed on the third plate opposite the thermoelectric module.

19. The heat exchanger of claim 16, wherein the hot side of the thermoelectric module is disconnected from the third plate.

20. A thermal electric power generator for converting thermal energy into electricity, the thermal electric power generator comprising:
   a first plate;
   a second plate;
   a third plate;
   a thermoelectric module disposed between the first plate and the third plate;
   a heating duct proximate the third plate;
   a heating fin extending from the third plate into the heating duct;
   a cooling duct disposed between the first plate and the second plate; and
   a cooling fin elastically compressed between the first plate and the second plate such that the cooling fin pushes the first plate against the thermoelectric module.

21. The thermal electric power generator of claim 20, wherein the thermal electric power generator comprises multiple cooling fins elastically compressed between the first plate and the second plate.

\* \* \* \* \*